United States Patent
Hurst et al.

(10) Patent No.: US 6,390,320 B2
(45) Date of Patent: *May 21, 2002

(54) EASILY INSTALLABLE AND REMOVABLE ELECTRO-MAGNETIC INTERFERENCE SHIELDING FACEPLATE

(75) Inventors: Douglas J. Hurst, Palo Alto; Brian D. Gant, San Jose; Sung Il Kong, San Pedro, all of CA (US)

(73) Assignee: Cisco Technology, Inc., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/069,532

(22) Filed: Apr. 29, 1998

(51) Int. Cl.[7] ................................................. H02G 3/14
(52) U.S. Cl. ..................... 220/241; 174/356 C; 220/3.8; 361/818
(58) Field of Search ........................ 220/3.8, 241, 242; 174/35 R, 356 C, 66, 67; 361/818, 816; 248/27.3

(56) References Cited

U.S. PATENT DOCUMENTS

| | | | | |
|---|---|---|---|---|
| 1,672,683 A | * | 6/1928 | Knoderer ..................... 220/3.8 |
| 2,510,745 A | * | 6/1950 | Kilgore ........................ 174/67 |
| 3,278,066 A | * | 10/1966 | George et al. .......... 220/787 X |
| 3,278,145 A | * | 10/1966 | Leshuk ...................... 248/27.3 |
| 3,279,729 A | * | 10/1966 | Buttriss ...................... 248/27.3 |
| 3,677,434 A | * | 7/1972 | Boyer ......................... 220/324 |
| 3,881,236 A | * | 5/1975 | Chaffee et al. ........... 29/896.22 |
| 4,560,083 A | * | 12/1985 | Danico .................... 220/326 X |
| 4,952,752 A | * | 8/1990 | Roun .......................... 174/35 R |
| 5,067,041 A | * | 11/1991 | Cooke et al. ................ 361/685 |
| 5,191,544 A | * | 3/1993 | Benck et al. .......... 174/35 R X |
| 5,233,507 A | * | 8/1993 | Gunther et al. ................ 174/35 |
| 5,343,361 A | * | 8/1994 | Rudy, Jr. et al. .......... 174/35 R |
| 5,353,201 A | * | 10/1994 | Maeda ...................... 174/35 R |
| 5,404,276 A | * | 4/1995 | Hansson et al. ............. 361/821 |
| 5,436,802 A | * | 7/1995 | Trahan et al. ............. 174/35 R |
| 5,610,368 A | * | 3/1997 | Smith ..................... 174/34 GC |
| 5,640,309 A | * | 6/1997 | Carney et al. ............... 361/801 |
| 5,783,777 A | * | 7/1998 | Kruse et al. ............ 361/801 X |
| 5,863,016 A | * | 1/1999 | Makwinski et al. ... 248/27.3 X |

FOREIGN PATENT DOCUMENTS

| | | | | |
|---|---|---|---|---|
| NL | 11664 | * | 2/1924 | ................. 220/3.8 |

* cited by examiner

Primary Examiner—Lee Young
Assistant Examiner—Joseph C. Merek
(74) Attorney, Agent, or Firm—Marger Johnson & McCollom, P.C.

(57) ABSTRACT

A faceplate according to the present invention is shown for covering an opening in a metal electrical equipment frame, such as a network router, which is inexpensive to produce and easy to install and remove. The faceplate is constructed of conductive metal having sufficient temper to obtain spring characteristics from components of the faceplate. A bracing tongue is formed in a first flange on one edge of the faceplate and is structured to engage an edge of the opening in the equipment frame between the bracing tongue and the first flange. A cantilever beam is formed in a second flange on an opposing edge of the faceplate. The cantilever beam is constructed to flex from a bias position upon pressure due to contact against another edge of the opening in the equipment frame. The cantilever beam also includes a notch or ridge that is positioned such that the cantilever beam flexes back towards its bias position when the beam clears the edge of the opening and the notch or ridge engages the edge of the opening between the second flange and the notch or ridge in the cantilever beam. The faceplate includes EMI tongues formed in flanges along the periphery of the faceplate which are constructed to have a bias position which causes the EMI tongues to flex against the edges of the opening and make good electrical contact with a metal equipment frame. The metal is pre-plated so that the faceplate can be formed in a single fabrication process. The faceplate can be easily installed in the opening in the equipment frame and is easily removed using a tool.

10 Claims, 6 Drawing Sheets

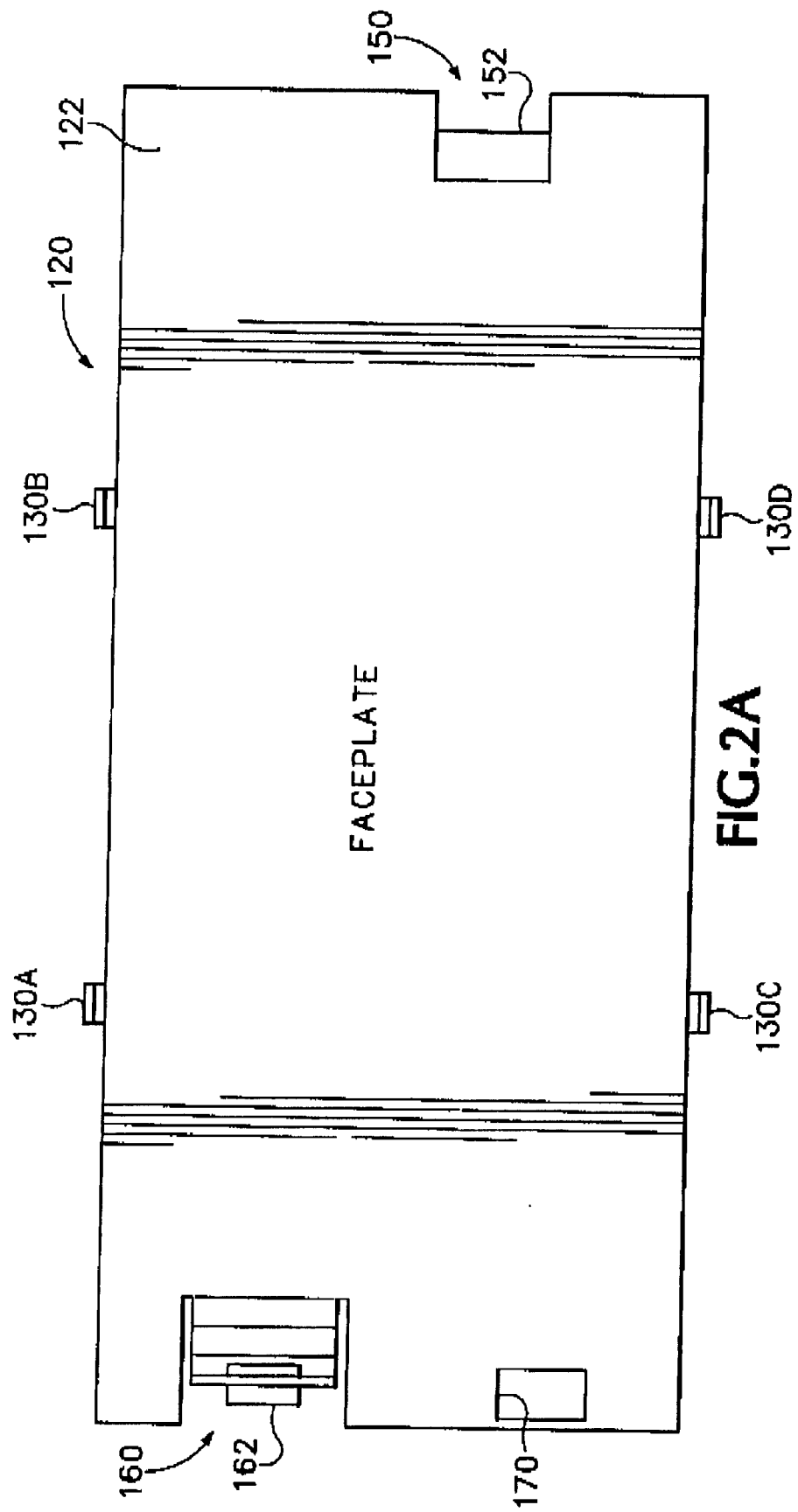

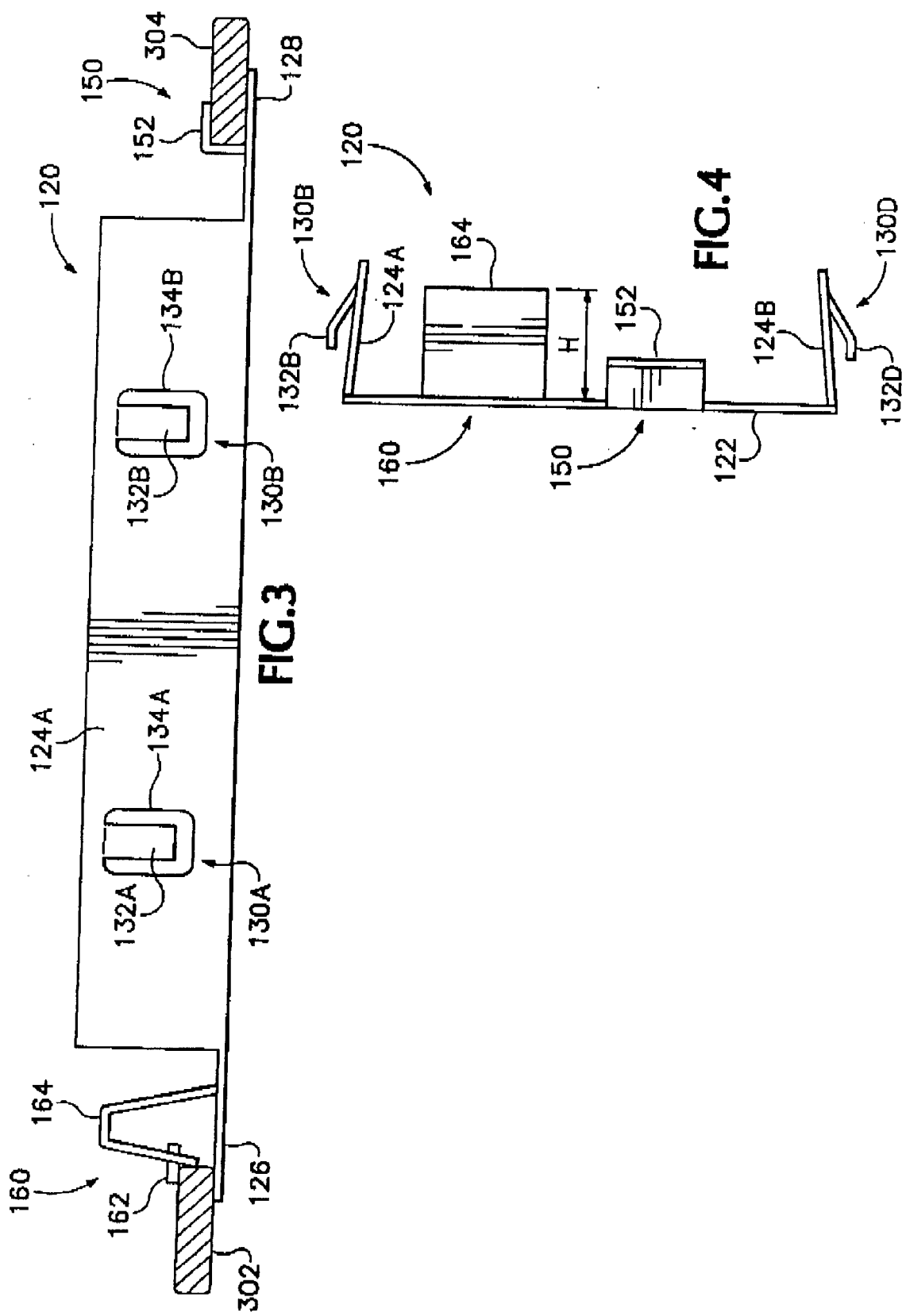

EASILY INSTALLABLE AND REMOVABLE ELECTRO-MAGNETIC INTERFERENCE SHIELDING FACEPLATE

FIELD OF THE INVENTION

The present invention relates generally to faceplates for electrical equipment which provide electromagnetic shielding.

BACKGROUND OF THE INVENTION

Network routers are electrical devices which transmit data packets between nodes on a network. Network routers are typically constructed to have multiple bays wherein each bay is constructed to receive a network module which routes network traffic. Each network module can handle a certain amount of traffic and the multiple bay structure allows a network router to be populated with a variable number of network modules to handle a variable amount of traffic. Examples of network routers are Cisco router models 2600, 3620 and 3640.

When a bay in a network router is left empty, then the opening in the front panel of the router must be covered with a faceplate. The opening must be covered to protect technicians from electrical shock from the voltages present within the router. Safety requirements, such as those promulgated by Underwriter's Laboratories, also require that the faceplate be designed such that a tool is required to remove the faceplate to avoid manual contact with electrical voltages within the network router, which are typically in the range of 100–240 volts at 2 amps of current.

In addition, the faceplate must be conductive and must be electrically connected to the chassis of the network router to prevent electromagnetic interference (EMI) signals from escaping from the network router. Covering the opening also helps to maintain the proper air flow within the network router.

FIG. 1 illustrates a frontal view of an embodiment of a network router 10 with conventional faceplates 20A–C. For simplicity, only faceplate 20A is discussed in detail, but the detail discussion of faceplate 20A applies with equal weight to faceplates 20B–C.

Faceplate 20A includes ears 22A and 26A which each include a hole (not shown) to accommodate screws 24A and 28A, respectively. Screws 24A and 28A are threaded into screw holes (not shown) formed in frame 12 of network router 10 in order to fasten faceplate 20A to the router. Threaded screw holes 16D and 18D, associated with network bay opening 14D, are shown and there are similar bay openings and associated screw holes underlying each of faceplates 20A–C. Faceplate 20A also includes EMI clips 30 which are fastened along the periphery of faceplate 20A and make contact with the frame 12. Faceplate 20A also typically includes airflow holes (not shown) formed in the faceplate.

Faceplate 20A is generally formed using cold rolled steel, such as steel with an Aim Rockwell 30-T scale hardness level of 46–52 (hereinafter referred to as T-1), which is relatively inexpensive, heavy gauge, and easy to make and form. To form the conventional faceplate 20A, production starts with cold rolled T-1 steel which is then stamped to form air holes and bent to form upper and lower edges of the faceplate. Screw holes are then punched and tapped to accommodate screws 24A and 28A. The steps described can be performed in the same stamping machine resulting in relatively low production costs.

However, when cold rolled steel is used, EMI clips 30 must be included to provide sufficient electrical contact with the frame 12 of router 10 in order to absorb the electrical noise signals generated within the router which must be prevented from leaving the router housing. The clips 30 are typically made from a Beryllium-Copper (Be—Cu) alloy which is relatively expensive. The addition of clips 30 also results in an additional assembly step.

The attachment of the assembled faceplate 20A to router 10 further requires screws 24A and 28A, which represent an additional cost and an additional, relatively time consuming, assembly step. Also, removal of the faceplate when a network module is installed in the corresponding bay of router 10 requires removal of the screws which is time-consuming and represents an opportunity for the installing technician to lose the screws inside the router 10 among high voltage power busses.

Accordingly, a need remains for a structure and method for covering an opening in an unused bay of a piece of electrical equipment which is inexpensive, convenient and which prevents EMI signals from escaping from the electrical equipment.

SUMMARY OF THE INVENTION

An embodiment of a faceplate for covering an opening in an equipment bay, according to the present invention, includes a metallic planar body having first and second edges, the first and second edges opposing one another, a first flange extending from the first edge of the planar body along the plane of the planar body and a bracing tongue formed on the first flange and configured to engage a first edge of the opening. The faceplate also includes a second flange extending from the second edge of the planar body along the plane of the planar body, a cantilever beam having distal and proximal portions, the proximal portion being in communication with the second flange wherein the cantilever beam extends outward from the plane of the planar body and has a bias position, and a latching mechanism formed on an end of the cantilever beam which is distal to the planar body, wherein the latching mechanism is configured to hold a second edge of the opening against the second flange.

An embodiment of a method for producing a faceplate, according to the present invention, includes providing a sheet of conductive material and cutting the sheet to form first, second, third and fourth flanges. The method then calls for cutting the first flange to form a first strip of material and bending the first strip of material to form a bracing tongue. The method also includes cutting the second flange to form a second strip of material and bending the second strip of material to form a cantilever beam. The method then calls for bending the third flange by at least ninety degrees and bending the fourth flange by at least ninety degrees.

Another embodiment of a faceplate for covering an opening of an equipment bay, according to the present invention, includes conductive shielding means for covering the opening, bracing means for securing the shielding means against a first edge of the opening, and latching means for securing the shielding means against a second edge of the opening.

The foregoing and other objects, features and advantages of the invention will become more readily apparent from the following detailed description of a preferred embodiment of the invention which proceeds with reference to the accompanying drawings.

BRIEF DESCRIPTION OF THE DRAWINGS

FIG. 2A is a frontal view of an embodiment of a faceplate according to the present invention.

FIG. 3 is a top view of the faceplate of FIG. 2A.

FIG. 4 is a side view of the faceplate of FIG. 2A.

DETAILED DESCRIPTION OF THE INVENTION

Referring now to FIG. 2A; a frontal view is shown of an embodiment of a faceplate 120, according to the present invention, of an inexpensive EMI shielding faceplate that can be easily installed and removed using a tool. The faceplate 120 includes a cantilever beam 160 positioned along a first edge of the faceplate and a bracing tongue 150 along a second edge which opposes the first edge. At various other points along the periphery of the faceplate are EMI tongues 130A–D which extend from flanges (not shown) along the other edges of the faceplate.

Figure 1:
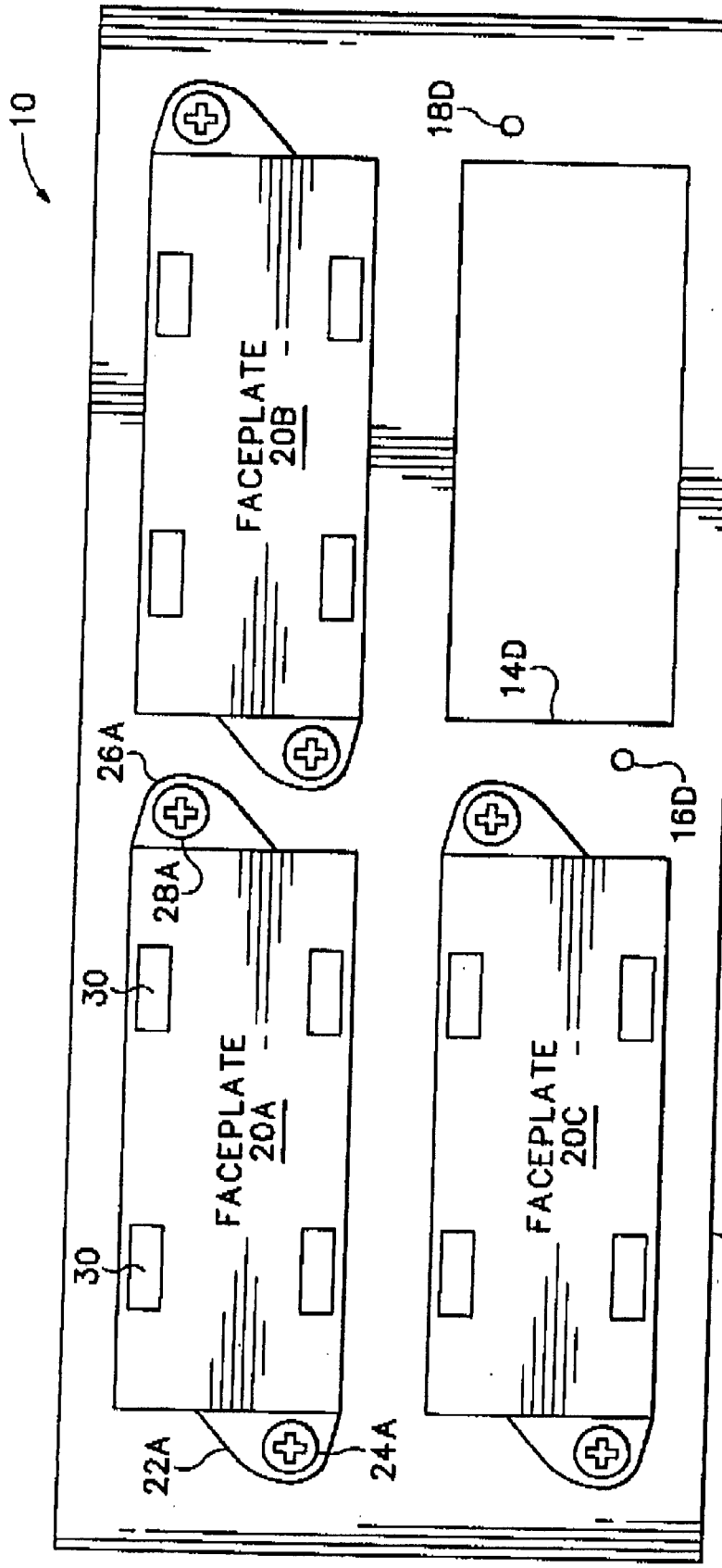
FIG. 1 is a frontal view of a network router with conventional faceplates covering openings for network module bays.
Figure 2B:
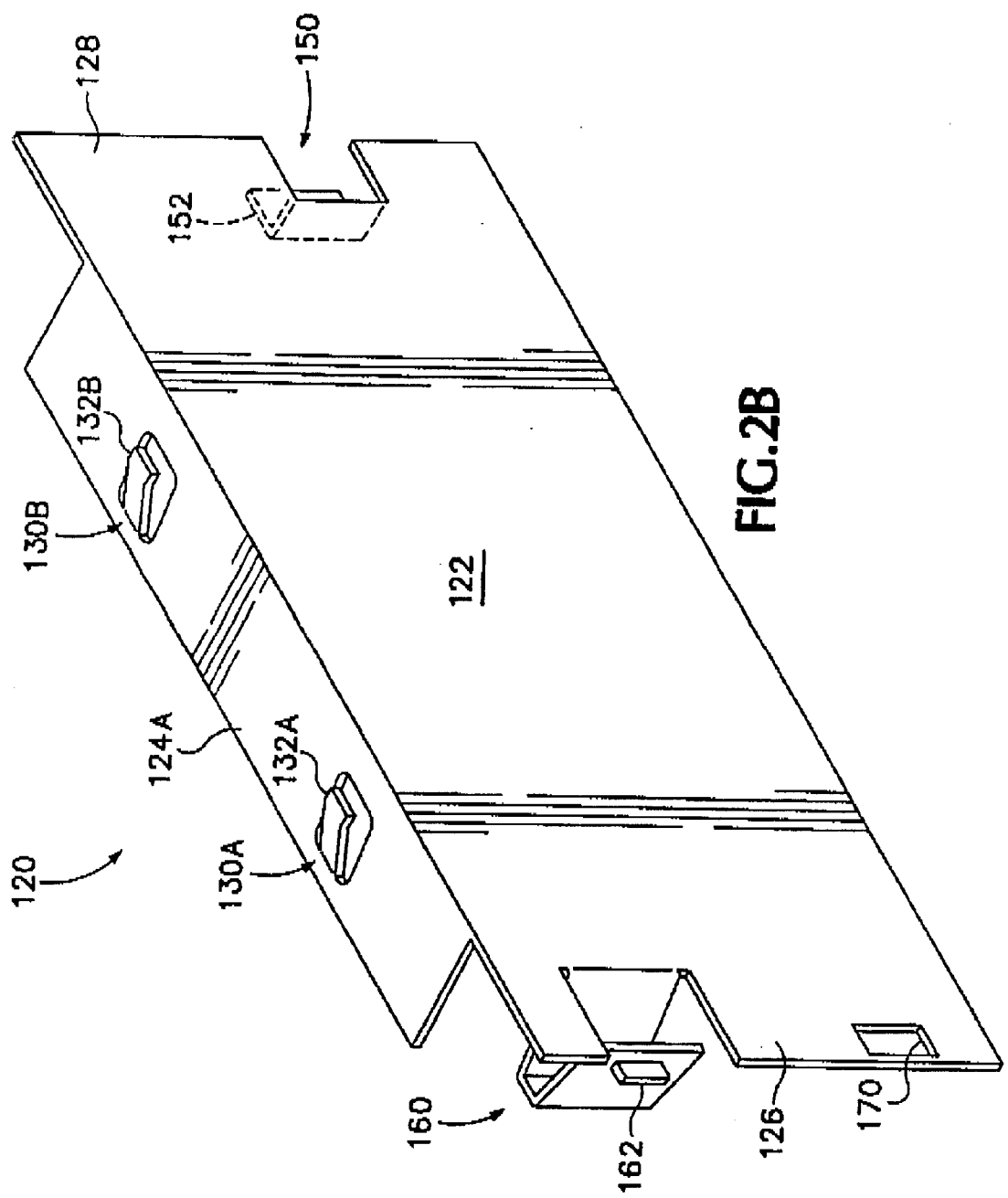
FIG. 2B is a perspective view of the faceplate of FIG. 2A.

FIG. 2B shows a perspective view of the faceplate 120 of FIG. 2A. FIG. 3 shows a top view of the faceplate 120 of FIG. 2A. The bracing tongue 150 and cantilever beam 160 work in concert to secure the faceplate 120 in the opening, such as bay opening 14D for a network module in the network router 10 of FIG. 1. The bracing tongue 150 braces against a first edge 304 of the bay opening 14D of the network router frame 12 while the cantilever beam 160 wedges against a second opposing edge 302 of the bay opening. The bracing tongue 150 is formed by cutting a metal strip from flange 128 and bending the metal strip in a proximal region adjacent the flange 128 and also in a medial portion of the metal strip to form an L shape. The L shape of bracing tongue 150 results in a bracing surface 152 which forms a gap between the elbow 152 and the flange 128 that is sufficient to accommodate the thickness of the second edge 304 of the bay opening. Alternatively, the bracing tongue can be configured to fit into a slot formed in the network router frame 12 of FIG. 1 which if further described below with respect to FIGS. 6A and 6B.

The cantilever beam 160 is spring tensioned so that it flexes against the first edge 302 of the bay opening under the pressure of insertion of the faceplate into the bay opening. The cantilever beam is composed of another metal strip 164 that is cut from flange 126 of faceplate 120 and then bent into an elbow. The metal strip 164 is bent in a proximal region of metal strip 164 adjacent flange 126 and is bent at least once in a medial region. A ridge 162 is also formed at a distal end of metal strip 164 at a point which is determined by the thickness of the edge 302 of the bay opening. The metal strip 164 is bent such that the cantilever beam 160 has a biased position. Once the cantilever beam 160 clears the first edge 302 of the bay opening, the beam 160 then springs back to its biased position and engages the first edge 302 between the ridge 162 and flange 126 to securely wedge the faceplate 120 within the bay opening.

EMI tongues 130A and 130B are formed in another flange 124A of the faceplate 120. The EMI tongue 130A is composed of a strip of metal 132A cut from flange 124A and disposed within an opening 134A. A proximal region of the strip of metal 132A in communication with flange 124A is bent such that, once the faceplate has been inserted into the bay opening, the EMI tongue 130A is biased to press against an adjoining edge of the bay opening to make an electrical contact with the frame of the network router. EMI tongue 130B is likewise formed from a strip of metal 132B cut from flange 124A and disposed within an opening 134B. EMI tongues 130C and 130D are similarly formed in a flange on the opposing edge of the faceplate 120 and are not shown.

FIG. 4 is a side view of the faceplate 120 of FIGS. 2 and 3 from the viewpoint of the side into which bracing tongue 150 is fabricated. Flanges 124A and 124B are each formed at approximately an 85 degree angle from the body 122 of the faceplate. The flanges 124A and 124B are bent. proximally to the body 122 such that they fit within the bay opening without coming into contact with a chassis cover or other parts of the network router housing and assist in bracing the faceplate within the bay opening. The metal strips 132B and 132D of EMI tongues 130B and 130D, respectively, are cut from flanges 124A and 124B, respectively. The metal strips 132B and 132D are bent such that they are biased to a position which diverges from the flanges 124A and 124B so as to make electrical contact with the bay opening 14D in FIG. 1.

The metal strip 152 of bracing tongue 150 faces outward from the drawing of FIG. 4 and extends away from flange 128, shown in FIG. 3, which is an extension of the main body 122 of faceplate 120. The length of metal strip 152 must be selected to be short enough such that the bracing tongue 150 is sufficiently rigid to brace the faceplate.

Cantilever beam 160 is facing inward to the drawing of FIG. 4. The length of metal strip 164 of cantilever beam 160 must be selected to be long enough such that the cantilever beam 160 has flexion. A height H in the range of 0.5 to 0.75 inches is sufficient with 0.5 inches providing better spring characteristics.

The faceplate 120 is installed by engaging one edge 304, shown in FIG. 3, of the bay opening 14D of FIG. 1 between the bracing tongue 150 and flange 128 with flanges 124A and 124B inserted within the opening. The faceplate 120 is then pushed into the opening until cantilever beam 160 contacts the opposing edge 302 of bay opening 14D deflecting the cantilever beam. When the opposing edge 302 clears ridge 162 then the cantilever beam 160 will flex back towards its bias position engaging opposing edge 302 between the ridge 162 and flange 126 to secure the faceplate within opening 14D. When the faceplate 120 is secured within the opening 14D, then at least a portion of EMI tongues 130A–D will be in electrical contact with edges of the opening and, therefore, with the frame 20 of network router 10.

Removal is obtained by inserting a screwdriver next to the cantilever beam and prying the faceplate 120 out with the optional pry-hole 170 shown in FIGS. 2A and 2B. As can be seen, both installation and removal of faceplate 120 are simpler than insertion and removal of screws 24A and 28A required for the installation and removal of conventional faceplate 20A of FIG. 1.

Figure 5A:
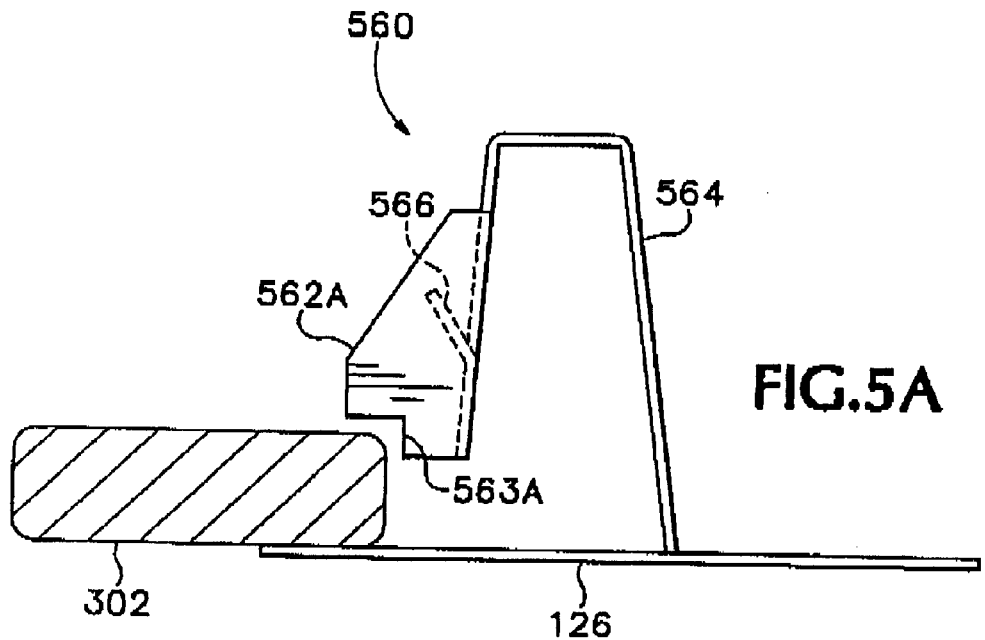
FIG. 5A is a side view of another embodiment of a cantilever beam for the present faceplate.
Figure 5B:
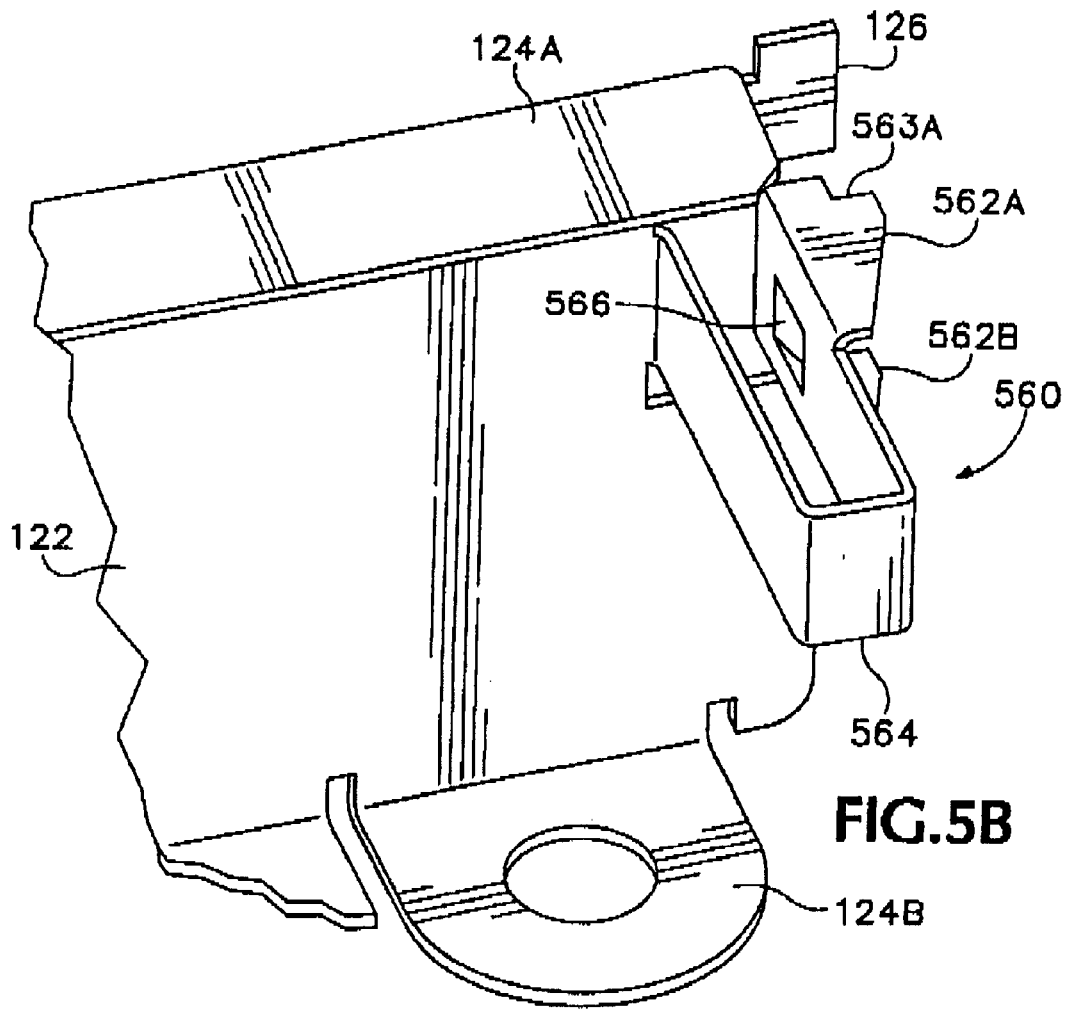
FIG. 5B is a backside perspective view of the cantilever beam of FIG. 5A.

FIGS. 5A and 5B illustrate another embodiment of a cantilever beam 560 for the faceplate 120 shown in FIGS. 2–4. FIG. 5A is a side view illustrating the cantilever beam 560 in cooperation with an edge 302 of a bay opening such as opening 14D of FIG. 1. FIG. 5B is a backside perspective view of cantilever beam 560. A metal strip 564 is cut from flange 126 and bent to form the cantilever beam 560. The metal strip 564 is also cut and bent so as to form latch mechanisms 562A and 562B on either side of the cantilever beam 560.

The latch mechanisms 562A and 562B are structured to engage the edge 302 of the bay opening. When faceplate 120 having cantilever beam 560 is inserted into the bay opening 14D, latch mechanisms 562A and 562B deflect the beam as they slide against edge 302 until the edge 302 clears notches 563A and 563B in latch mechanisms 562A and 562B, respectively, at which point beam 560 returns to its bias position and latches edge 302 between latch mechanisms 562A and 562B and flange 126.

Metal strip 564 is further cut to form a deflection tongue 566 on the cantilever beam 560. To remove faceplate 120 having cantilever beam 560, a screwdriver is inserted along metal strip 564 such that the screwdriver contacts the deflection tongue causing the cantilever beam 560 to deflect away from edge 302 releasing the edge and allowing faceplate 120 to be pried out of opening 14D using the screwdriver engaged against deflection tongue 566.

The faceplate 120 is constructed from a pre-coated thin-gauge metal that is highly conductive and resists oxidation, such as electrolytic pre-coat steel with an Aim Rockwell 30-T scale hardness level in the range of 62–68 (hereinafter referred to as T-5). The metal must have a thin gauge and tempering in the Aim Rockwell range of 62–68 to get the spring characteristics needed to accommodate the flexion and biased position of the cantilever beams 160 and 560 and the EMI tongues 130A–D. A thickness of 0.0160 inches, approximately 0.4 millimeters, in metal with a Aim Rockwell 30-T scale hardness level in the range of 62–68 works well. If electrical components are to be mounted on the faceplate 120, then metal with a gauge of about 0.039 inches, or approximately 1 millimeter, is necessary to provide adequate mechanical support for mounting. The metal must be highly conductive and resist oxidation so that EMI tongues 130A–D make good electrical contact with the metal frame 12 of network router 10 of FIG. 1 and absorb the EMI generated within the bay opening, such as opening 14D in FIG. 1, into which the faceplate 120 is inserted.

T-5 pre-coat steel is less expensive than other types of springy metal, such as phosphor-bronze alloy, and it can be stamped and finished in a single processing procedure without the need for an additional plating step. Air holes can be stamped into the faceplate in the same processing procedure if needed.

Figure 6A:
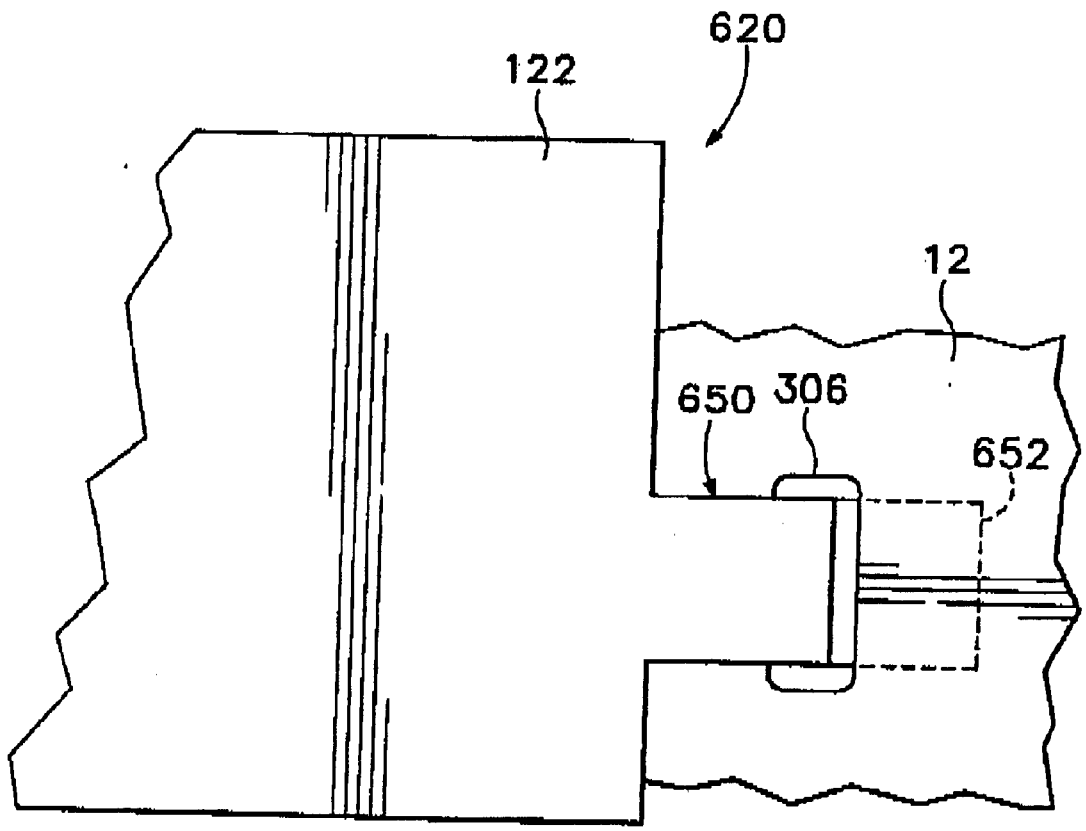
FIG. 6A is a partial frontal view of an embodiment of a faceplate according to the present invention having a bracing tongue which fits into a slot on an equipment frame.
Figure 6B:
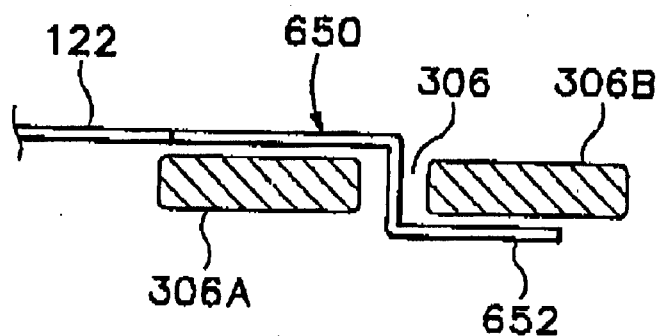
FIG. 6B is a top view of the faceplate of FIG. 6A.

FIGS. 6A and 6B illustrate portions of another embodiment of a faceplate, according to the present invention, wherein a bracing tongue 650 is configured to fit within a slot 306 in the face of the equipment frame 12 of FIG. 1. FIG. 6A is a front view of the faceplate 620 having a bracing tongue 650. The bracing tongue 650 is formed by a strip of metal extending from the main body 122 of the faceplate. The strip of metal is bent medially such that a distal portion 652 of the bracing tongue 650 can be inserted through a slot 306 on the face of the frame 12 to brace against an inner surface of the faceplate.

FIG. 6B is a side view of the faceplate 620. The bracing tongue 650 extends from the main body 122 of the faceplate 620 and is bent to pass between the sides 306A and 306B of the slot 306 in frame 12. The distal portion 652 is thus inside the frame 12 and braces against the inner surface of the frame 12 to hold the faceplate 620 in place when a cantilever beam, such as those discussed above, is braced against another portion of the frame 12.

The production cost for the faceplate according to the present invention is approximately one quarter of that for the conventional faceplate. In addition, there are savings from the easier installation and removal of the present faceplate from network routers.

Having described and illustrated the principles of the invention in a preferred embodiment thereof, it should be apparent that the invention can be modified in arrangement and detail without departing from such principles. For instance, though the present invention is described in the context of a network router, the structure and method of the present invention is applicable in the context of a metal equipment housing having openings that need to be covered to avoid EMI. We claim all modifications and variations coming within the spirit and scope of the following claims.

What is claimed is:

1. A removable faceplate for covering an opening in a computer equipment bay, the faceplate comprising:

a removable metallic planar body having first and second edges, the first and second edges opposing one another;

a first flange extending from the first edge of the planar body along a plane of the planar body and formed from a same piece of metal forming the planar body;

a bracing tongue formed on the first flange and capable of engaging a first edge of the opening;

a second flange extending from the second edge of the planar body along the plane of the planar body and formed from the same piece of metal forming the planar body;

a cantilever beam bent from a portion cut in the second flange having distal and proximal portions, a first end of the proximal portion being bent outward from a portion of the second flange starting from a location offset back from a lateral side of the second flange, the entire proximal portion extending outward from the plane of the planar body capable of inserting completely into the opening, the entire distal portion extending back toward the plane of the planar body but not extending back past the plane of the planar body so that the entire cantilever beam is capable of residing inside the computer equipment bay when the faceplate is fully inserted into the opening, the distal and proximal portions deflectable and then flexible back into a bias position; and a latching mechanism formed on an end of the distal portion of the cantilever beam which is distal to the planar body, wherein said latching mechanism includes a ridge disposed in the distal portion of said cantilever beam and having a longitudinal axis substantially parallel to the plane of the planar body, said cantilever beam capable of wedging against a second edge of the opening and the ridge and said second flange extending along opposite sides of that second edge, the faceplate capable of being engaged to the first and second edges of the opening by inserting the faceplate into the opening causing the distal portion of the cantilever beam to contact the second edge of the opening deflecting the cantilever beam until the second edge of the opening clears the latching mechanism allowing the cantilever beam to flex back towards the bias position and the entire cantilever beam to reside inside the equipment bay.

2. The faceplate of claim 1 further comprising;

a third flange formed along a third edge of the planar body, the third flange having a plane angled toward the center of the planar body in a first direction; and a plurality of EMI tongues formed within an opening in the third flange, each one the plurality of EMI tongues extending outward from the plane of the third flange in a second direction opposite to the first direction, wherein each of said tongues is bent and biased to a position diverging from the third flange and capable of making electrical contact with an edge of the opening and absorbing EMI generated within the opening.

3. The faceplate of claim 1, wherein the bracing tongue further comprises a strip of material cut from the first flange and bent into an L shape, wherein a proximal region of the L shape extends from the first flange and a distal region of the L shape is parallel to the first flange.

4. The faceplate of claim 1, wherein the bracing tongue is capable of engaging a slot in a frame of the equipment bay adjacent the opening.

5. The faceplate of claim 1, wherein the faceplate is constructed using pre-plated metal having an Aim Rockwell 30-T scale hardness level in the range of 62 to 68.

6. A metal electrical equipment frame comprising an equipment bay having an opening and a faceplate for covering the opening of the equipment bay, the faceplate comprising:

conductive shielding means including top and bottom ends and lateral sides capable of covering the opening;

electrical conducting means including a plurality of EMI tongues formed from associated top or bottom flanges that extend firm the top and bottom ends of the conductive shielding, respectively, each one of the plurality of EMI tongues extending outward from the associated top or bottom flanges and bent in a position diverging from the associated top or bottom flanges capable of making electrical contact with one of a top or bottom edge of the opening and absorbing EMI generated within the opening;

bracing means extending from a first one of the lateral sides of the shielding means capable of securing the shielding means against a first lateral edge of the opening;

latching means extending from a second one of the lateral sides of the shielding means capable of securing the shielding means against a second lateral edge of the opening, wherein the latching means ether comprises:

a flange portion formed from a same piece of material that forms the conductive shielding means;

flexing means formed from the same piece of material that forms the flange portion and the conductive shielding means including a first proximal portion bent out of a section of the flange portion extending substantially perpendicular and completely outward away from a planar surface of the conductive shielding means and a distal portion extending substantially perpendicular and inward back toward the planar surface of the conductive shielding means but not extending past the planar surface of the conductive shielding means so that the flexing means never extends across the planar surface of the conductive shielding means; and a ridge disposed in the distal portion of the flexing means having a longitudinal axis substantially parallel to a planar top surface of the faceplate.

7. The faceplate of claim 1, wherein said cantilever beam has a height of between 0.5 to 0.75 inches.

8. The faceplate of claim 2, wherein said third flange is formed at approximately an 85 degree angle from the body of the faceplate.

9. A faceplate for covering an opening in an equipment bay, the faceplate comprising:

a metallic planar body having first and second edges, the first and second edges opposing one another, a first flange formed from a same piece of metal forming the metallic planar body extending from the first edge of the planar body along a plane of the planar body;

a bracing tongue comprising part of the first flange and bent from a location offset back from a side of the first flange and configured to engage a first edge of the opening;

a second flange formed from the same piece of metal forming the metallic planar body and extending from the second edge of the planar body along the plane of the planar body;

a cantilever beam having distal and proximal portions comprising a portion of the second flange, the proximal portion having a fist end bent from a portion of the second flange starting at a location on the second flange offset back from a side edge of the second flange and extending outward away from the plane of the planar body and residing completely on a first side of the planar body and the distal portion extending from a second end of the proximal portion toward the plane of the planar body while remaining entirely on the first side of the planar body, the cantilever beam having a bias position; and a latching mechanism formed on the distal portion of the cantilever beam and residing completely on a first side of the planar body beam and having a longitudinal axis substantially parallel to the plane of the planar body while being spaced apart from the proximal portion and including a notched portion disposed adjacent the distal portion of the cantilever beam, the cantilever beam capable of wedging against a second edge of the opening causing said notched portion to seat over a corner of said second edge.

10. The faceplate of claim 9, wherein said cantilever beam includes a deflection tongue thereon capable of prying the faceplate out of the opening.

* * * * *